United States Patent [19]

Sato

[11] Patent Number: 4,733,075
[45] Date of Patent: Mar. 22, 1988

[54] STROBOSCOPIC SCANNING ELECTRON MICROSCOPE

[75] Inventor: Masayuki Sato, Zama, Japan

[73] Assignee: Kabushiki Kaisha Toshiba, Kawasaki, Japan

[21] Appl. No.: 898,814

[22] Filed: Aug. 18, 1986

Related U.S. Application Data

[63] Continuation of Ser. No. 658,217, Oct. 5, 1984, abandoned.

[30] Foreign Application Priority Data

Oct. 20, 1983 [JP] Japan ............................. 58-196303

[51] Int. Cl.$^4$ ...................... G01N 23/00; H01J 37/26
[52] U.S. Cl. ................................. 250/310; 250/505.1
[58] Field of Search .......... 250/309, 300, 305, 396 R, 250/505.1; 324/158 R

[56] References Cited

U.S. PATENT DOCUMENTS 3,845,305 10/1974 Liebl .................... 250/310
3,876,879 4/1975 McAdams et al. ........ 250/310
4,255,661 3/1981 Liebl .................... 250/310

OTHER PUBLICATIONS

Sato et al, "Electron Beam Testing Techniques for Dynamic Memory", 15th Conference on Solid State Devices and Materials, Tokyo, 1983, pp. 273, 276.
Sato et al, "Improvement of the EB Testing in 256K Dynamic RAM", Material for 85th Study Meeting of 132 Committee of Japan Science Promotion Society (Nov. 11-12, 1983).
L. J. Balk et al., "Quantitative Voltage Contrast at High Frequencies in the SEM", Scanning Electron Microscopy, 1976, pp. 615-624 (Apr. 1976).

Primary Examiner—Bruce C. Anderson
Attorney, Agent, or Firm—Schwartz, Jeffery, Schwaab, Mack, Blumenthal, Evans

[57] ABSTRACT

An electron microscope is provided in which in order to monitor operating waveforms within the element of a semiconductor integrated circuit, an electron beam is bombarded from an electron gun to the measuring point of a specimen to be measured, the resultant secondary electron emitted from the specimen to be measured is detected by a secondary electron detector in order to build up an image, and in which the specimen to be measured is stroboscopically scanned by controlling the electron gun with sampling pulses. A shield electrode is mounted nearest to the measuring point of the specimen to be measured such that the influences of the adjacent potentials different from that of the measuring point of the specimen to be measured, can be eliminated.

3 Claims, 4 Drawing Figures

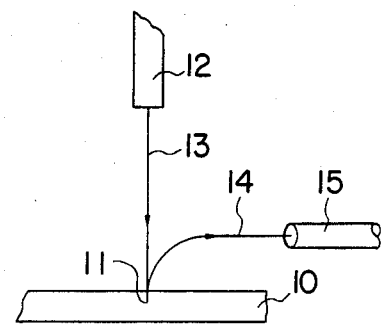
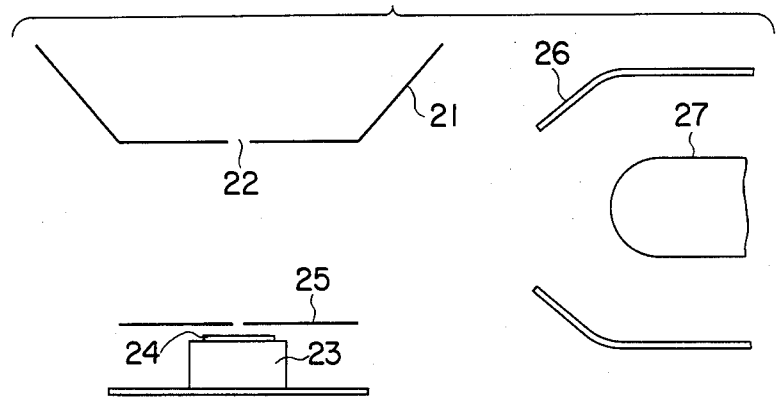

STROBOSCOPIC SCANNING ELECTRON MICROSCOPE

This application is a continuation of application Ser. No. 658,217, filed Oct. 5, 1984, abandoned.

BACKGROUND OF THE INVENTION

1. Field of the Invention

The present invention relates to a stroboscopic scanning electron microscope, and more specifically it relates to such a microscope as an electron beam tester for monitoring a working signal waveform in the element of such as a semiconductor integrated circuit device.

2. Description of the Related Art

The integration density of semiconductor devices is continually improving, and semiconductor integrated circuits with a high integration density, such as LSI, VLSI or the like, are now brought into existence. In the manufacturing process of such semiconductor integrated circuits, it is common to test the working performance of the semiconductor element before assembling it within an envelope. The test is carried out by contacting a mechanical probe with a predetermined conductive layer portion of the semiconductor element in order to detect a signal waveform at a connection point (node) between respective circuit blocks while operating the semiconductor element, and by monitoring the waveform on an oscilloscope or the like.

The higher the integration density of the element, the smaller becomes the electrostatic capacitance of the node from which a working signal waveform is derived, due to thinning of the width of an interconnection wire. Thus, the electrostatic capacitance of the mechanical probe itself becomes relatively large, and measurement errors may occur. Further, it is difficult to mechanically contact with the node, so a precise measurement can not be ensured.

For this reason, a measurement has been done by using a non-contact type electron probe. The measurement makes use of a phenomenon that when the primary electron is bombarded upon a measuring point the amount of the secondary electron emitted out from the point varies with the surface potential of the measuring point. The non-contact electron probe is generally called a stroboscopic scanning electron microscope, or an electron beam tester. The electron beam tester comprises a scanning type electron microscope, a measuring control system such as for giving sampling pulses to the scanning type electron microscope for its stroboscopic operation, an element drive system for driving the element to be measured, an image processing system, and the like.

In the stroboscopic scanning electron microscope, however, there gives rise to a problem that a measurement accuracy is degraded under the influence of other interconnecting wires or the like adjacent to the measuring point.

SUMMARY OF THE INVENTION

The present invention has been made in order to solve the above mentioned problems, and it is an object of the present invention to provide a stroboscopic scanning electron microscope which can measure the potential at the measuring point without being subjected to a local electrical field effect caused by the potentials existing near the measuring point.

In order to attain the above object, the stroboscopic scanning electron microscope according to the invention is constructed such that a shield electrode having a shape encircling a measuring point of a specimen is mounted near and above the specimen, and that the shield electrode is supplied with a fixed potential lower than that of the specimen thereby enabling to decrease the effects of the high potentials around the measuring point.

BRIEF DESCRIPTION OF THE DRAWINGS

FIG. 1 is a view illustrating a measurement principle of an electron beam tester incorporating a stroboscopic scanning electron microscope;

FIG. 2 is a schematic cross-sectional view showing the arrangement of the stroboscopic scanning electron microscope according to the present invention;

DETAILED DESCRIPTION OF THE PREFERRED EMBODIMENTS

Figure 3:
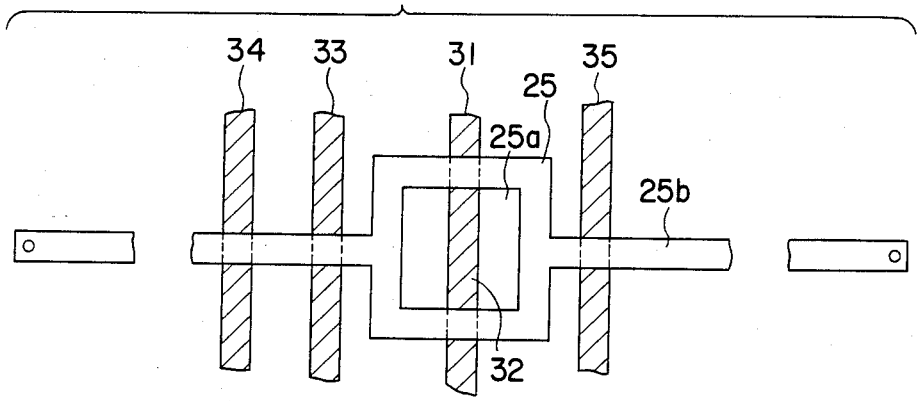
FIG. 3 is a plan view showing a shield electrode which is one of the characteristic features of the present invention.

First, the principle of a stroboscopic electron microscope and the technical problem to be solved by the present invention will be explained with reference to FIG. 2, and then the description of the embodiments of the present invention will be made with reference to FIGS. 2 through 4.

FIG. 1 is a view illustrating the measurement principle of the above described electron beam tester. A semiconductor element 10 supplied with a source voltage and a certain signal from an element drive system (not shown) and driven into operation, is bombarded with an electron beam 13 from an electron gun 12. In the case that the potential of the measuring point 11 is at a higher level, the secondary electron 14 having a negative potential and emitted from the measuring point, is attracted to the measuring point, and only a small amount of the secondary electron is detected by a detector 15 which includes a high voltage tube located about 7 cm remote from the measuring point. Conversely, in the case that the potential of the measuring point is at a lower level, almost all of the secondary electron emitted from the measuring point is detected by the detector 15. Intermittent electron beams 13 are supplied to the measuring point by opening or closing a pulse gate with sampling pulses synchronizing with the working signal, and the secondary electron detected by the detector 15 is image-converted. Thus, the cyclical change of the potential of the measuring point can be monitored as if the potential stands still.

The secondary electron emitted from the measuring point is attracted by the detector including the high voltage tube. It is to be noted however that since the detector is located remotely from the measuring point by about 7 cm, the influence of the electrical field appears which is generated by the presence of other interconnecting wires or the like having certain potentials, near the measuring point. This is referred to as a local electrical field effect, and the compensation measure for this has been proposed. However, the compensation is difficult to carry out or it ends unsatisfactorily because of the fact that the signal lines or the like varying in level are most likely to be located nearer to the measuring point due to the recent minituarization and higher integration of semiconductor elements.

FIG. 2 is a schematic cross-sectional view showing the arrangement of the present invention, featuring in that a shield electrode 25 is mounted above a specimen holder 23 on which a specimen 24 is placed. The shield electrode is supplied with a fixed potential lower than a ground potential. A pole piece 21 of an object lens for converging an electron beam generated from an electron gun (not shown), is also positioned above the specimen holder 23. The electron beam is bombarded to the specimen 24 through a central opening 22 of the pole piece. The specimen holder can be moved in the X and Y directions by manipulating outwardly of the microscope tube so that the measuring point can be selected as desired. The secondary electron emitted from the measuring point of the specimen 24 is detected by a detector including a scintillator 27 biased at about 10 Kv high voltage relative to a collector 26, and is delivered to an image processing section (not shown) in order to obtain a desired image.

The detail of the shield electrode 25 is shown in FIG. 3.

FIG. 3 is an enlarged view of the surface of a semiconductor element to be measured as seen from above the shield electrode. In this embodiment, a measurement signal line 31 with a measuring point 32, and adjacent signal lines 33, 34, 35 are provided on the semiconductor element. The shield electrode comprises a center portion and a supporting portion 25b. The center portion is provided with a square opening 25a so formed as to encircle the measuring point 32 of the measurement signal line 31. The shield electrode is fixed at a predetermined position within the microscope tube by means of screws, and is positioned above and adjacent to the surface of the semiconductor element to be measured.

It is assumed here that the potential of the measuring point is 0 V, and the adjacent signal lines 33 and 35 are at a high potential. Upon bombardment of the electron beam to the measuring point, the secondary electron is generated. In this case, if the shield electrode 25 is not present, the secondary electron is attracted to the adjacent signal lines 33, 35 due to the influence of electrical fields generated from the adjacent signal lines 33, 35. Therefore, the amount of the secondary electron which is detected by the detector is decreased. Conversely, if the shield electrode 25 fixed at a lower potential than the ground potential, is disposed around the measuring point 32 and within the adjacent high potential portions, the influence of the fixed potential of the shield electrode is greater than that of the adjacent high potential portions thereby enabling to substantially decrease the influence of the adjacent high potential portions. The fixed potential may be selected as desired in accordance with the configuration of the measuring point or the like. Since the potential is fixed as it is, the secondary electron information detected by the detector can be easily compensated for. The shield electrode can be obtained, for example, by subjecting an inert metal such as tungsten or gold to an etching process.

Figure 4:
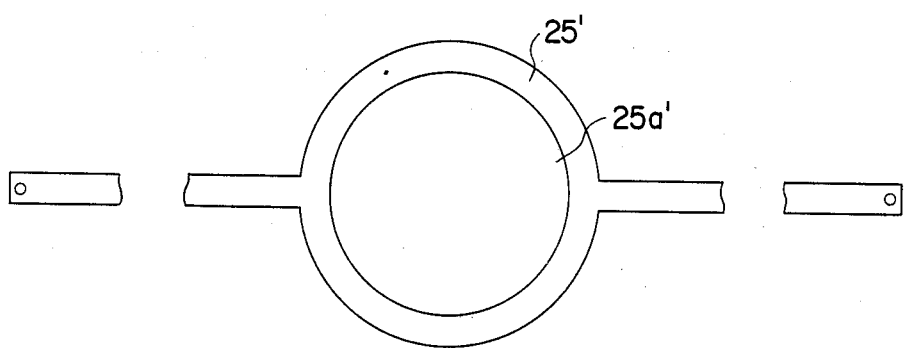
FIG. 4 is a plan view of a shield electrode according to another embodiment of the present invention.

FIG. 4 is a plan view illustrating another embodiment of the shield electrode. The opening portion 25a' of the shield electrode has a circular shape. In this case, since the electrical field of the shield electrode 25' has the same strength in all directions relative to the measuring point, there is a characteristic feature that a better shielding effect is obtained when compared with that in a square shape.

In the above embodiment, the stroboscopic scanning electron microscope has been applied to an electron beam tester for analyzing the operation of semiconductor elements, however, it is not limited thereto. It is also possible to apply the present invention to a stroboscopic scanning electron microscope and its applications such as for measurement of the specimen having a high potential portion adjacent to the measuring point.

According to the stroboscopic scanning electron microscope of the present invention, a shield electrode is mounted above and adjacent to the specimen to be measured, the electrode having an opening which encircles the measuring point on the inner side of the high potential portion existing around the measuring point. The shield electrode is also supplied with a fixed potential lower than the ground potential. Therefore, the influence upon the secondary electrode of the high potential portion around the measuring point is lowered, and the compensation for the potential information of the secondary electron can be made with ease. Thus, it is possible to measure correctly without any error and to analyze an operation of the device.

What is claimed is:

1. In a stroboscopic scanning electron microscope comprising an electron gun for emitting a primary electron beam into a tube of a microscope, a specimen holder for holding a specimen to be measured, said specimen comprising an integrated semiconductor device having a measuring point and at least one electrically conductive line adjacent said measuring point and a secondary electron detector for detecting secondary electrons emitted from the specimen, said primary electron beam emitted from said electron gun being made intermittent by opening and closing a pulse gate with a sampling pulse, and in which said secondary electrons emitted from said specimen to be measured are detected by said secondary electron detector in order to build up an image; said stroboscopic scanning electron microscope having a shield electrode means for eliminating local electric fields surrounding said measuring point on said specimen, said shield electrode means mounted above and ajacent to said specimen to be measured, said shield electrode means having an opening which surrounds said measuring point of said specimen, said shield electrode being supplied with a negative voltage which is sufficiently lower than ground potential for eliminating the local electric fields, said measuring point having a portion existing therearound due to said local electric fields caused by said at least one electrically conductive line, and wherein said portion has a first potential and said shield electrode is supplied with a second potential opposite said first potential so as to eliminate said local electric fields surrounding said measuring point.

2. A stroboscopic scanning electron microscope as set forth in claim 9 in which the opening of said shield electrode is substantially square in shape.

3. A stroboscopic scanning electron microscope as set forth in claim 1, in which the opening of said shield electrode is substantially circular in shape.

* * * * *